| United States Patent [19] | [11] Patent Number: 4,890,780 |
|---|---|
| Mimata et al. | [45] Date of Patent: Jan. 2, 1990 |

[54] MANUFACTURING APPARATUS

[75] Inventors: Tsutomu Mimata, Akikawa; Toshihide Uematsu, Hinode; Katsuhiro Tabata, Higashimurayama, all of Japan

[73] Assignee: Hitachi, Ltd., Tokyo, Japan

[21] Appl. No.: 93,715

[22] Filed: Sep. 8, 1987

Related U.S. Application Data

[63] Continuation of Ser. No. 800,708, Nov. 22, 1985, abandoned.

[30] Foreign Application Priority Data

Nov. 22, 1984 [JP] Japan ............................ 59-246025

[51] Int. Cl.$^4$ ...................... H01L 21/60; H01L 21/56
[52] U.S. Cl. .................................... 228/4.5; 264/272.17; 98/115.3
[58] Field of Search .................. 228/57, 4.5; 98/115.3, 98/115.1; 264/272.17

[56] References Cited

U.S. PATENT DOCUMENTS

| 3,102,331 | 9/1963 | Costa | 228/4.5 |
|---|---|---|---|
| 3,875,853 | 5/1975 | Puklinrood | 98/115.1 |
| 4,016,809 | 4/1977 | Austin | 98/115.3 |
| 4,297,940 | 11/1981 | Hainlini | 98/115.1 |
| 4,534,921 | 8/1985 | Firekens et al. | 264/272.17 |
| 4,557,184 | 12/1985 | Oui et al. | 98/115.3 |

FOREIGN PATENT DOCUMENTS

| 0139128 | 5/1985 | European Pat. Off. ........... 98/115.3 |
|---|---|---|
| 52-222883 | 2/1977 | Japan ................................. 98/115.3 |
| 58129125 | 9/1986 | Japan . |

OTHER PUBLICATIONS

"The Design Handbook for Cleaning Room with Ventilation and Airconditioning", the 11th Design and Research Academy of the 45th Ministry of Machine Building (pp. 97–112), 1980.
"The Introduction Book of CKL-A Diffusion Furnace with Program Control", the First Semiconductor Equipment Factory in Beijing.

*Primary Examiner*—Kenneth J. Ramsey
*Attorney, Agent, or Firm*—Antonelli, Terry & Wands

[57] ABSTRACT

A manufacturing apparatus has a clean air supply means provided integrally with a part thereof for supplying clean air toward at least an area in which a workpiece exists, and an air discharge means disposed so as to face the clean air supply means across the workpiece and adapted to discharge the air to the outside of the apparatus. It is therefore possible for clean air to be constantly supplied to the workpiece area under positive pressure. Thus, there is no risk of dust generated not only inside but also outside the apparatus being moved to the vicinity of the workpiece. Accordingly, it is possible to prevent adhesion of dust to the surface of the workpiece by the apparatus alone and also possible to install the apparatus as desired.

6 Claims, 7 Drawing Sheets (A)

(B)

(A)

(B)

(A)

(B)

MANUFACTURING APPARATUS

This is a continuation of application Ser. No. 800,708, filed Nov. 22, 1985, now abandoned.

BACKGROUND OF THE INVENTION

The present invention relates to a manufacturing apparatus and, more particularly, to a manufacturing apparatus which may be effectively applied to an apparatus for assembling a semiconductor device which is capable of preventing dust from adhering to a semiconductor element chip as a workpiece when being assembled.

In an apparatus for manufacturing semiconductor devices such as ICs or LSIs, particularly in so-called post-processes carried out before a fabricated semiconductor element chip is packaged, the element, chip is processed in an exposed state, which fact applicants have found involves the problem of adhesion of dust to the surface of the element chip and to the surfaces of other elements. For example, in a chip bonding process in which an element chip is bonded to a package base, dust adhering to the surface of the package base lowers the reliability in bonding of the chip. Applicants have also found that in a wire bonding process, or a resin molding process (for a plastic molded type package), dust adhering to the surface of an element chip causes a wire bonding failure, or a resin molding failure.

FIG. 4 shows a conventionally used wire bonder. In this type of wire bonder, a wire bonder mechanism 102 is mounted on a lower housing 100 which incorporates various control units 101, such as an electrical control unit, and a wire is connected to a workpiece W (i.e., an element chip secured to a package base) set on a bonding stage 103 in the wire bonder mechanism 102. In addition, fans 104 and filters 105 are provided inside the lower housing 100 so as to circulate air through the inside of the lower housing 100, thereby cooling the control units 101.

In this type of wire bonder, dust is generated as a result of the friction occurring between portions of various machine elements within the wire bonder mechanism (e.g., a cam mechanism) 102, and this dust adheres to the surface of the workpiece W set on the bonding stage 103. Further, the action of the fans 104 for cooling the control units 101 causes a turbulent air flow by which dust generated not only inside but also outside the housing 100 is blown up to adhere to the surface of the workpiece W.

The dust adhering to the surface of the workpiece (chip) W, applicants have found, may cause a wire connection failure at an electrode pad, or adversely effect the bond between the chip and the resin in the resin molding operation carried out as a post-process, resulting in problems such as adversely affecting the moistureproofing of the product.

Similarly, in a resin molding machine shown in FIG. 5, an exhaust duct 112 is connected to the upper side of a housing 110 of a molding mechanism 111, and dust generated in the housing 110 is discharged together with air through the exhaust duct 112. In this type of resin molding machine, due to the positional relationship among the exhaust duct 112 and upper and lower cavity blocks 113 and 114 disposed so as to face each other, a turbulent air flow is easily caused inside the housing 110, and dust is thereby easily blown up, particularly in the area between the upper and lower cavity blocks 113 and 114. In consequence, the dust may adhere to the surface of the workpiece W immediately before a resin molding operation, and, applicants have found, adversely affect the moistureproofing of the product, as described above.

It is known from Japanese Patent Laid-Open No. 162335/1981 to provide a clean bench in a clean room for wafer fabrication processes. However, the reference does not disclose using such clean air equipment during so-called post-processes or assembly stages of semiconductor manufacture.

SUMMARY OF THE INVENTION

It is an object of the present invention to provide a manufacturing apparatus which is capable of suppressing or preventing adhesion of any dust to the surface of a workpiece in a wire bonder, a resin molding machine or other semiconductor device manufacturing machine so that it is possible to improve the reliability of a semiconductor device produced.

It is another object of the present invention to provide a manufacturing apparatus which is capable of preventing any dust from being blown up in the vicinity of a workpiece by virtue of the arrangement of the apparatus alone, thereby allowing the apparatus to be installed irrespective of whether a clean room or a clean bench is employed, and thus increasing the degree of freedom in installation of the apparatus.

It is still another object of the present invention to provide a manufacturing apparatus which is capable of accomplishing the above objects, wherein the actual processing equipment for performing operations such as wire bonding or molding is a conventional manufacturing machine which is either, unmodified or slightly modified.

The above and other objects and novel features and advantages of the present invention will become clear from the following description thereof and the accompanying drawings.

Typical arrangements according to the present invention will be briefly described below.

Namely, according to one aspect of the present invention, there is provided a manufacturing apparatus comprising: clean air supply means formed integrally with a part of the apparatus to supply clean air so as to flow toward at least an area in which a workpiece exists; and air discharge means formed integrally with a part of the apparatus such as to face the clean air supply means across the workpiece and adapted to discharge the thus supplied air to the outside of the apparatus. By virtue, of this arrangement, the area in which the workpiece exists can constantly be supplied with clean air under a positive pressure condition, so that there is no risk of any dust generated not only inside but also outside the apparatus being moved to the vicinity of the workpiece. Accordingly, it is possible to prevent adhesion of any dust to the surface of the workpiece by the apparatus alone and also possible to install the apparatus as desired.

According to another aspect of the present invention, there is provided a manufacturing apparatus comprising an air bench structure and a manufacturing apparatus body which is originally formed separately from the air bench structure which has clean air supply means for supplying clean air to the apparatus body and discharge means for discharging air to the outside of the apparatus body, wherein the apparatus body is integrally incorporated in the air bench structure in such a manner that the apparatus body is positioned between the clean air supply means and the discharge means, and whereby dust generated inside and outside the apparatus body can be quickly discharged to the outside of the air bench structure, thereby preventing adhesion of any dust to the surface of the workpiece, and thus increasing the degree of freedom in installation of the apparatus as a whole.

BRIEF DESCRIPTION OF THE DRAWINGS

The aforementioned and other objects and novel features of the present invention will become apparent from the following description taken with reference to the accompanying drawings, in which.

DESCRIPTION ON THE PREFERRED EMBODIMENTS

(Embodiment 1)

Figure 1:
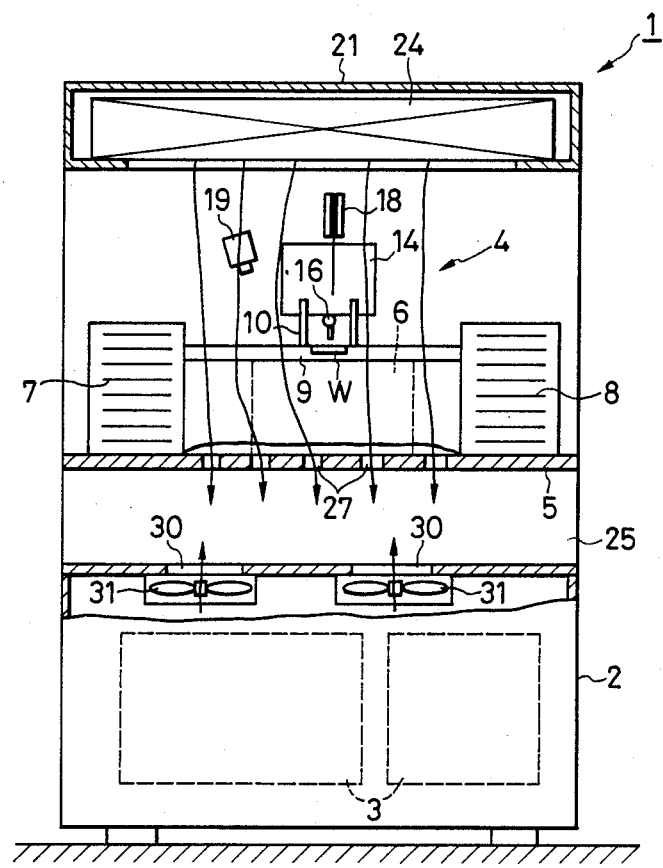
FIGS. 1(A) and 1(B) are a front elevational view and a side elevational view, respectively, of one embodiment of the present invention in which it is applied to a wire bonder.
Figure 1:
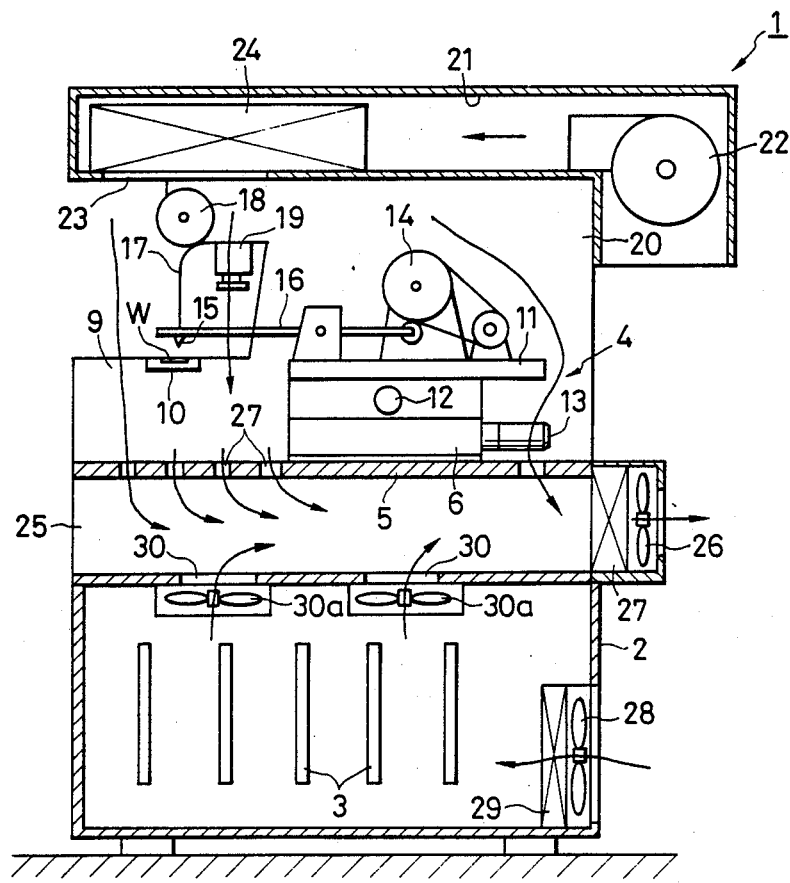

FIGS. 1(A) and 1(B) show in combination one embodiment of the present invention in which it is applied to a wire bonder which connects a wire between a semiconductor element chip and an external lead. This wire bonder 1 has a lower housing 2 housing control units 3 (detailed description thereof is omitted), and a so-called wire bonder mechanism 4 disposed on the upper side of the lower housing 2. The wire bonder mechanism 4 has an XY table 6 installed on the approximately central portion of a base 5. A loader unit 7 and an unloader unit 8 are provided on the base 5 at the left- and right-hand sides respectively thereof as viewed from the front side of the wire bonder 1. Between the loader unit 7 and the unleader unit 8 is stretched a guide rail 9 for transporting a semiconductor structure W as a workpiece from the loader unit 7 to the unloader unit 8. The approximately central portion of the guide rail 9 is defined as a bonding stage 10. It is a matter of course that various devices and mechanisms such as a heater and a work transporting mechanism (not shown) are provided at the bonding stage 10.

A bonding head 11 is mounted on the XY table 6. The bonding head 11 can be moved in both X- and Y-directions by means of drive motors 12 and 13 for the X- and Y-directions, respectively. A cam mechanism 14 stands on the bonding head 11. A bonding arm 16 which has a bonding tool 15 mounted at its distal end is pivotally supported on the bonding head 11. The bonding arm 16 is pivoted vertically by the action of the cam mechanism 14, thereby allowing the bonding tool 15 to move vertically above the bonding stage 10. Above the bonding tool 15 are disposed a spool 18 having a wire 17 wound thereon and a TV camera 19 for viewing the surface of the workpiece W on the station 10, the spool 18 and the TV camera 19 being mounted on and supported by an upper housing 20 which is formed integrally with the base 5.

The upper housing 20 also incorporates some control elements. A flat duct 21 is formed at the uppermost position in the upper housing 20 in such a manner that at least a portion of the duct 21 extends over the bonding stage 10. A large-sized fan 22 is incorporated in the upper housing 20 and at the rear side of the duct 21 so that outside air is sucked into the duct 21 by the action of the fan 22. An opening 23 and a filter 24 are disposed at the lower side of the extending portion of the duct 21, that is, the portion of the duct 21 which is located directly above the bonding stage 10, so that the air inside the duct 21 is cleaned by the filter 24 and is blown out downward from the opening 23.

On the other side, the base 5 is hollow and has an exhaust duct 25 defined by the hollow inside thereof. The duct 25 is provided at its rear side with a fan 26 for discharging the air in the duct 25 to the outside, and a filter 27. Further, a multiplicity of throughholes 27 are opened in the upper surface of the base 5, whereby the inside of the upper housing 20, that is, the space area in the upper housing 20 which contains the cam mechanism 14 and the bonding stage 10 of the wire bonder mechanism 4, is communicated with the exhaust duct 25.

It is to be noted that the lower housing 2 is provided therein with a multiplicity of fans for cooling the control units 3 incorporating electrical control units for various mechanisms of the bonder. In this embodiment, a fan 28 for introducing air into the lower housing 2 and a filter 29 are provided at the rear side of the lower housing 2. On the other hand, openings 30 and fans 30a for discharging the air in the lower housing 2 are provided at the lower side of the base 5, whereby the inside of the lower housing 2 is communicated with the exhaust duct 25.

According to the above arrangement, the duct 21 provided on the upper side of the upper housing 20, together with the fan 22 and the filter 24, constitutes a clean air supply means whereby the outside air is sucked into the duct 21 by the fan 22 and cleaned by the filter 24 before being blown out downward from the opening 23. This clean air flows down around the bonding stage 10 and the bonding head 11 as shown by the illustrated arrows while cleaning the atmosphere around of these portions. The clean air further flows down and is then sucked into the exhaust duct 25 through the throughholes 27 by the action of the fan 26 provided in the duct 25, the duct 25 and the fan 26 constituting in combination an air discharge means. The air is then discharged to the outside. At the same time, the air which is cleaned by virtue of the operations of the fan 28 and the filter 29 flows into the lower housing 2 as shown by the illustrated arrows and then flows through the area between the control units 3 inside the housing 2 while cooling the control units 3 before being discharged into the exhaust duct 25 through the openings 30 by the action of the upper fans 30a. Thereafter, this air is discharged to the outside of the duct 25 by the action of the fan 26 in a manner similar to the above.

Thus, according to this wire bonder 11, each of the workpieces W contained in the loader unit 7 is moved rightward (as viewed in FIG. 1(A)) along the guide rail 9 so as to be set on the bonding stage 10, where a wire bonding operation is carried out by the action of the XY table 6, the cam mechanism 14, the bonding arm 16 and so forth. During this wire bonding operation, the bonding stage 10 is constantly supplied with clean air from the opening 24 of the upper duct 21. For this reason, the atmosphere of the bonding stage 10 is extremely clean so that there is no risk of any dust or foreign substance adhering to the surface of the workpiece W. Even if dust or the like is generated at the bonding stage 10, the dust can be removed downward by the flow of the clean air.

Any dust which is generated as a result of friction occurring between machine elements of the cam mechanism 14 and those of the XY table 6 is carried away downward by the above-described flow of the clean air. There is therefore no risk of the dust entering the area of the bonding stage 10 which is on the upstream side of the cam mechanism 14 and the XY table 6 and under positive pressure. The dust moved downward enters the exhaust duct 25 through the through-holes 27 and is then discharged to the outside. At this time, the air containing the dust generated in the vicinity of the floor outside the lower housing 2 is sucked into the lower housing 2 by the action of the fan 28 while being cleaned by the filter 29, and there is no risk of the dust reaching the bonding stage 10. Moreover, any dust generated within the lower housing 2 is discharged to the outside through the duct 25 by the action of the fans 28 and 31.

By virtue of the above arrangement, it is possible to increase the degree of cleanness of the air at the wire bonder mechanism 4, particularly at the bonding stage 10 to a range between 1,000 and 10,000, and further to about 500, so that it is possible to effectively prevent the adhesion of dust to the surface of the workpiece W and hence improve the reliability of the semiconductor device produced. Since the above advantages are obtained by virtue of the arrangement of the wire bonder 1 alone, the place for installation of the wire bonder 1 is not restricted.

(Embodiment 2)

Figure 2:
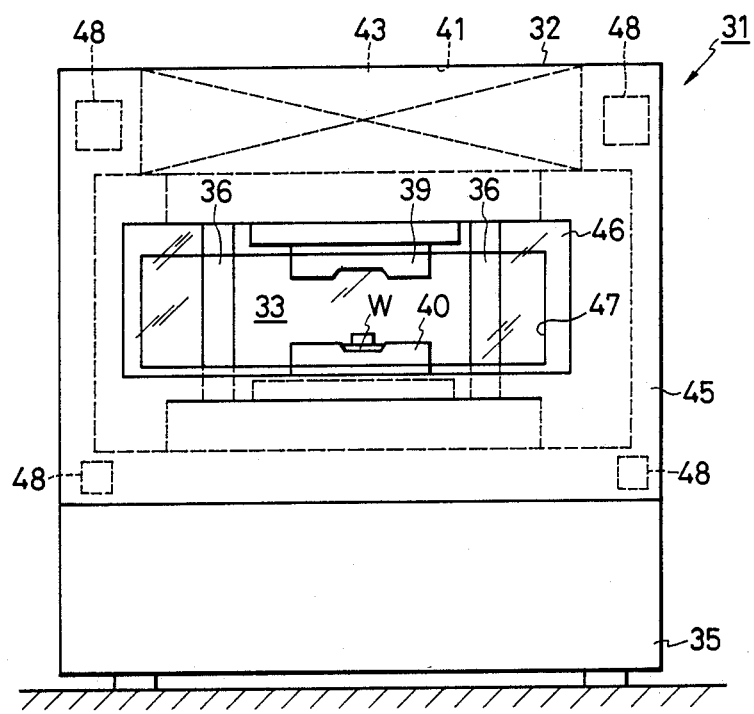
FIGS. 2(A) and 2(B) are a front elevational view and a side elevational view, respectively, of another embodiment of the present invention in which it is applied to a resin molding machine.
Figure 2:
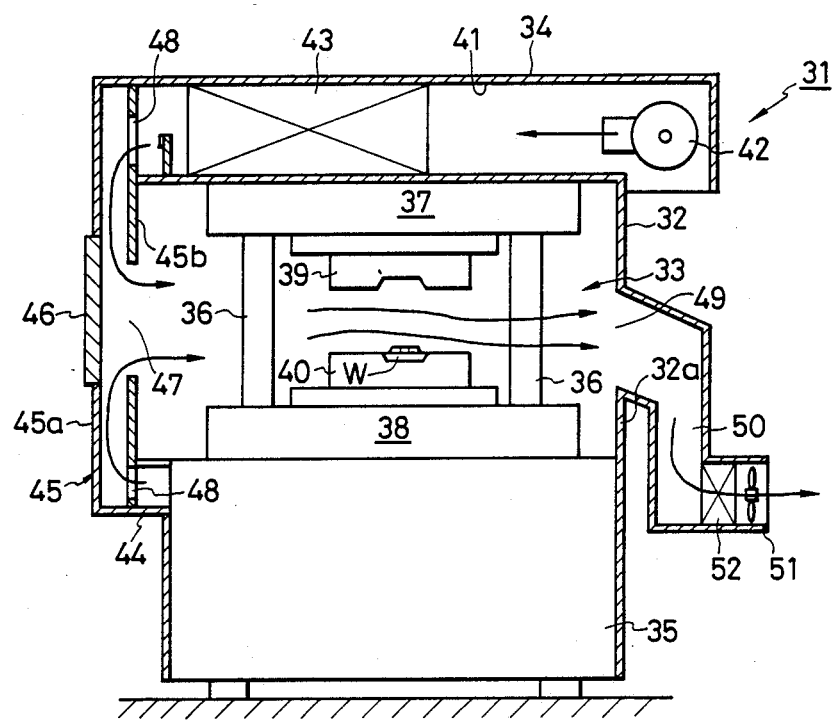

FIGS. 2(A) and 2(B) show in combination another embodiment of the present invention in which it is applied to a resin molding machine. In this molding machine 31, a molding structure 33 is provided in a housing 32, and a clean air supply structure 34 is formed so as to be disposed at the upper, front and rear sides of the housing 32.

The molding structure 33 has upper and lower platens 37 and 38 vertically movably provided on guide posts 36 which stand on a lower mechanism 35 (detailed description thereof is omitted). Upper and lower cavity blocks 39 and 40 are respectively mounted on the upper and lower platens 37 and 38. A resin is forced into a cavity (not shown) which is defined between the upper and lower cavity blocks 39 and 40 by the action of a plunger mechanism (not shown) which is provided, for example, on the upper cavity block 39, whereby a semiconductor structure (workpiece) W set in the cavity can be sealed with the resin by means of molding.

On the other hand, the clean air supply structure 34 has a flat duct 41 which constitutes the upper wall of the housing 32, and a fan 42 and a filter 43 are disposed in the duct 41, whereby the outside air is introduced into the duct 41 and cleaned. The clean air supply structure 34 further has a squarely looped duct 44 and a double front wall 45 provided on the housing 32, the duct 44 being communicated with the duct 41, and the double front wall 45 being disposed on the front side of the housing 32. The double front wall 45 is constituted by an outer plate 45a and an inner plate 45b. A transparent window 46 is provided in the center of the outer plate 45a so as to enable the molding structure 33 to be observed from the outside. An opening 47 is formed in the center of the inner plate 45b so as to face approximately the central portion of the molding structure 33. In addition, communicating bores 48 which are communicated with the squarely looped duct 44 are formed in the four corners of the inner plate 45b.

An exhaust port 49 for discharging air is formed in the approximately central portion of the rear wall 32a of the housing 32 and is connected to an exhaust duct 50. A fan 51 and a filter 52 are disposed at the distal end of the duct 50, and thus the air inside the housing 32 can be discharged to the outside from the exhaust port 49 by the action of the fan 51 while being cleaned by the filter 52.

According to the above arrangement, the clean air which is supplied into the duct 41 of the clean air supply structure 34 by the fan 42 and through the filter 43 flows into the squarely looped duct 44 and is then supplied to the inside of the double front wall 45 through the communicating bores 48 formed in the four corners of the inner plate 45b. The clean air is then supplied into the housing 32 through the opening 47 of the front wall 45 so as to flow as shown by the illustrated arrows. The thus supplied clean air is introduced into the exhaust duct 50 through the exhaust port 49 formed in the rear wall 32a of the housing 32 and is then discharged to the outside through the filter 52 by the action of the fan 51.

Therefore, immediately before a molding operation, that is, in a state wherein the upper and lower cavity blocks 39 and 40 in the molding structure 33 are vertically separated from each other, the above-described clean air is supplied so as to flow through the area between the upper and lower cavity blocks 39 and 40 while cleaning the atmosphere of this area. For this reason, it is possible to prevent any dust from adhering to the surface of the workpiece W set between the upper and lower cavity blocks 39 and 40, so that it is possible to improve the adhesion between the resin and the surface of the workpiece (chip) W sealed with the resin by means of molding. At this time, the area between the upper and lower cavity blocks 39 and 40 is under a positive pressure condition by virtue of the flow of the clean air. There is therefore no risk of the dust generated at other portions inside the housing 32 being moved to the area between the cavity blocks 39 and 40.

In this embodiment also, it is possible to obtain a highly reliable semiconductor device by preventing adhesion of any dust to the surface of the chip W. In addition, since it is possible to maintain a clean environment with the manufacturing apparatus alone, the place for installation of the apparatus is not restricted, so that it is possible to increase the degree of freedom in installation of the apparatus.

(Embodiment 3)

Figure 3:
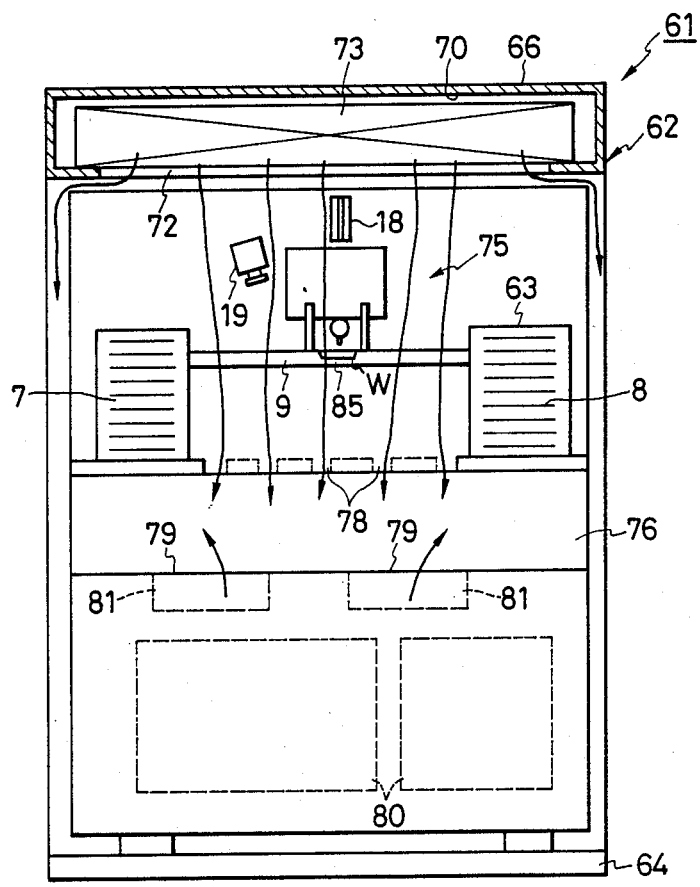
FIGS. 3(A) and 3(B) are a front elevational view and a side elevational view, respectively, of still another embodiment of the present invention in which it is applied to a wire bonder.
Figure 3:
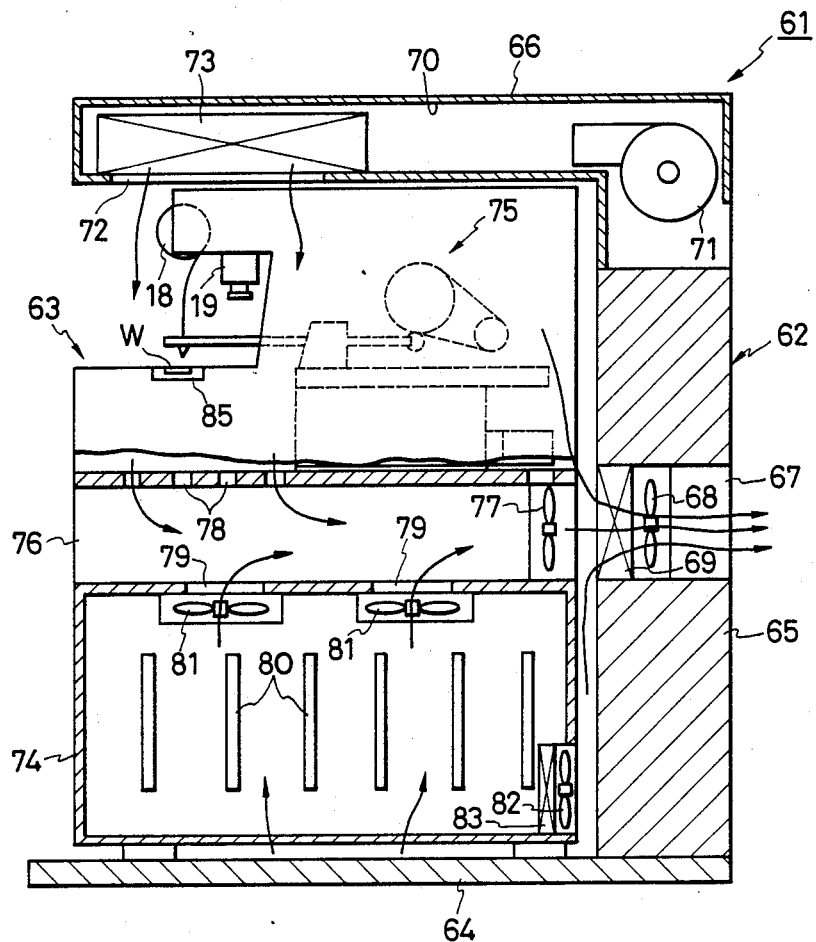
Figure 4:
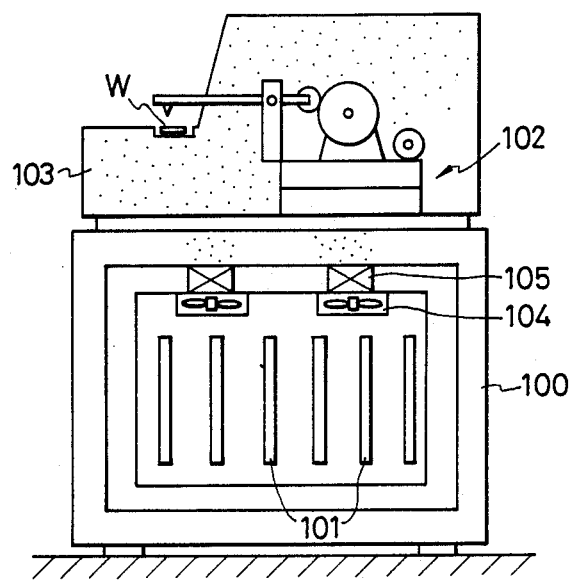
FIG. 4 is a side elevational view of a conventional wire bonder, which is employed to describe disadvantages thereof.
Figure 5:
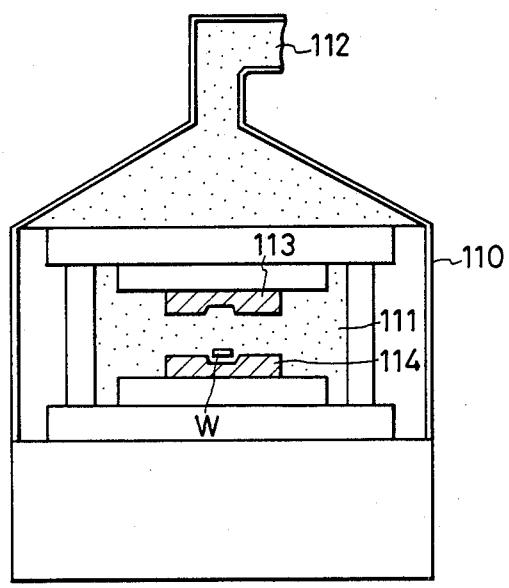
FIG. 5 is a side elevational view of a conventional resin molding machine, which is employed to describe disadvantages thereof.

FIGS. 3(A) and 3(B) show in combination still another embodiment of the present invention in which it is applied to a wire bonder. In this wire bonder 61, an air bench structure 62 and a wire bonder body 63 which are originally formed separately from each other are integrally associated with each other.

The air bench structure 62 is formed from a base 64, a vertical wall 65 and an upper wall 66 such as to have a substantially U-shaped configuration The wire bonder body 63 is installed on the base 64. A horizontal bore 67 is formed in the vertical wall 65 so as to extend therethrough horizontally. A fan 68 and a filter 69 are disposed in the horizontal bore 67 so that air is supplied by the fan 68 so as to flow from the front to the rear of the air bench structure 62 through the filter 69. The upper wall 66 is formed such as to constitute a hollow flat duct 70. The duct 70 is provided at the rear side thereof with a fan 71 which supplies the outside air into the duct 70. An opening 72 is formed in the lower side of the duct 70 so as to extend over substantially the entire area thereof, and a filter 73 is disposed in the duct 70 so as to extend over the opening 72, whereby the outside air is supplied through the duct 70 while passing through the filter 73 so as to be cleaned and is blown out downward from the opening 72 as clean air.

As the wire bonder body 63, a conventional wire bonder can be utilized as it is. However, it is preferable to arrange the wire bonder such that, as shown in the Figures, an exhaust duct 76 is provided between a lower housing 74 and a wire bonder mechanism 75 disposed on the upper side of the housing 74, and a fan 77 is provided at the rear side of the duct 76. A multiplicity of through-holes 78 are formed in the upper side of the exhaust duct 76 so that the air in the vicinity of the wire bonder structure 75 is supplied into the duct 76 through the through-holes 78. Openings 79 are also formed in the lower side of the exhaust duct 76, and fans 81 for cooling control units 80 inside the lower housing 74 are provided so as to face the respective openings 79. A fan 82 and a filter 83 are disposed at the rear of the lower housing 74 so that cooling air is introduced in to the lower housing 74 through the filter 83.

The other elements shown in FIGS. 3(A) and 3(B) which are the same as those shown in FIGS. 1(A) and 1(B) are denoted by the same reference numerals, and description thereof is omitted.

By virtue of the above arrangement, as the fan 71 of the air bench structure 62 is activated, the outside air is introduced into the duct 70 and passed through the filter 73 so as to be cleaned and is then blown out downward form the opening 72. This clean air then flows through and around the upper space in the wire bonder body 63 and through the inside of the wire bonder mechanism 75 while cleaning, particularly the atmosphere of the workpiece W set on the bonding stage 85. The clean air thus flowing down enters the exhaust duct 76 through the through-holes 78 and is then discharged to the rear side of the wire bonder body 63 by the action of the fan 77. The air is then discharged to the outside by the action of the fan 67 of the air bench structure 62 while being cleaned by the filter 68. At this time, the air flowing through the outside of the wire bonder mechanism 75 is also discharged to the rear of the air bench structure 62 by the action of the fan 67.

In the lower housing 74, clean air is supplied into the housing 74 by the action of the fan 82 through the filter 83 so as to cool the control units 80. The air is then discharged into the exhaust duct 76 by means of the fans 81 and is further discharged to the rear side of the air bench structure 62 through the duct 76.

According to this embodiment, the adhesion of any dust to the surface of the workpiece W set on the bonding stage 85 can be prevented by means of the clean air flowing down from the opening 72 formed in the upper wall 66 of the air bench structure 62. In addition, this clean air flow prevents dust generated in the wire bonder mechanism 75 or at the outside the air bench structure 62 from reaching the bonding stage 85. Dust generated inside or outside the lower housing 74 is also directly discharged to the rear side of the air bench structure 62 through the exhaust duct 76 by the action of the fan 68. There is therefore no risk of the dust adhering to the surface of the workpiece W set on the bonding stage 85.

It is possible according to this embodiment to utilize a conventional wire bonder body as it is or by partly modifying it. It is therefore possible to readily form the apparatus effectively utilizing an existing apparatus and yet to effectively prevent the adhesion of any dust to the surface of the workpiece.

The present invention offers the following advantages.

(1) A manufacturing with a clean air supply means and the air discharge means in such a manner that clean air is supplied so as to flow through the area including the workpiece. Accordingly, the workpiece area is constantly maintained in a clean atmosphere under positive pressure, so that there is no risk of any dust generated not only inside but also outside the apparatus being moved into the workpiece area, and it is therefore possible to effectively prevent adhesion of dust to the surface of the workpiece.

(2) An apparatus body is disposed between the clean air supply section and the air discharge section of an air bench which is originally formed separately from the apparatus body, and these members are integrally associated with each other. It is therefore possible for clean air to be supplied to the inside and outside of the apparatus body under positive pressure. Accordingly, the degree of cleanliness of the atmosphere of the apparatus body is increased, so that it is possible to effectively prevent adhesion of any dust to the surface of the workpiece.

(3) A means for supplying clean air is provided integrally with a manufacturing apparatus, or an air bench which is originally formed separately from the apparatus is assembled integrally with the apparatus. Accordingly, it is possible to clean the atmosphere of the workpiece with the apparatus alone, so that restrictions on location of the apparatus can be lessened, and it is therefore possible to increase the degree of freedom in installing the apparatus.

(4) By providing a wire bonder with a clean air supply means and an air discharge means, it is possible to increase the degree of cleanliness, particularly in the bonding stage area, so that it is possible to prevent adhesion of any dust to the surface of the workpiece which is to be subjected to wire bonding, and thereby to improve the reliability of the wire bonding. In addition, it is possible to improve the adhesion at the interface between the workpiece and the resin in the resin molding process carried out as a post-process and hence enhance the reliability of the product, such as the moistureproofing.

(5) By arranging a resin molding machine such that clean air can be supplied so as to flow through the area between the upper and lower cavity blocks, the atmosphere of the workpiece which is to be subjected to wire bonding can be cleaned, and it is thereby possible to prevent adhesion of dust to the surface of the workpiece and hence improve the adhesion between the workpiece and the resin and the reliability of the product.

(6) An air bench which is originally formed separately from a wire bonder body is integrated with the wire bonder body. It is therefore possible to supply clean air to the wire bonder body so as to prevent adhesion of dust to the surface of the workpiece set on the bonding stage, thereby improving the reliability in wire bonding and resin molding operations similarly to the above. As the wire bonder body, it is possible to employ a conventional one unmodified or with a slight modification, which fact is advantageous in arranging the apparatus.

Although the invention accomplished by the present inventor has been described by way of the embodiments thereof, it is evident that the present invention is not necessarily limited to the above-described embodiments and various changes and modifications may be imparted thereto without departing from the scope of the invention. For example, the practical arrangement of the ducts, fans, filters and so forth which are employed to constitute the clean air supply means and the air discharge means may appropriately be changed or modified. Further, the arrangement may be such that a part of the clean air is circulated inside the apparatus. Furthermore, it is possible to additionally provide the clean air supply means with means for controlling temperature and humidity.

Although the above description has been made with respect to the embodiments of the invention accomplished by the present inventor in which it is applied to either a wire bonder or a resin molding machine in the field and as the background of the invention, the invention is not necessarily limited thereto and may be applied to other manufacturing machines which are employed in various manufacturing processes, such as a chip (pellet) bonder, an aligner and so forth.

What is claimed is:

1. In an assembly method carried out on a semiconductor workpiece comprising molding said semiconductor workpiece in a resin between upper and lower cavity blocks of a resin molding machine, said semiconductor workpiece having been processed by a wafer fabrication process at a location separate from said resin molding machine before said molding, the improvement comprising the steps of placing said semiconductor workpiece between said upper and lower cavity blocks while said cavity blocks are located within a housing of the resin molding machine, supplying clean air from a clean air supply means to one side of the area between said upper and lower cavity blocks under a positive pressure in a direction toward a first side of said semiconductor workpiece, drawing said air through exhaust duct means of air exhaust means in a location facing said clean air supply means on a side of said workpiece opposite to said first side, and wherein said air is exhausted in such a manner as to thereby prevent adhesion of dust to surfaces of said semiconductor workpiece during said assembly method in said resin molding machine.

2. In an assembly method carried out on a semiconductor workpiece comprising bonding wires to said semiconductor workpiece on a bonding stage of a wire bonder mechanism, said semiconductor workpiece having been processed by a wafer fabrication process at a location separate from said bonder mechanism before said bonding, the improvement comprising the steps of supplying clean air from a clean air supply means disposed above at least the bonding stage of the bonder mechanism and formed integrally with a part of said bonder mechanism under a positive pressure in a direction toward a first side of said semiconductor workpiece, and exhausting said air from below said bonding stage through air exhaust means formed integrally with a part of said bonder mechanism and disposed in a location facing said clean air supply means on a side of said workpiece opposite to said first side to thereby produce a downward flow of clean air toward said semiconductor workpiece set on said bonding stage.

3. The method according to claim 2, wherein each of said clean air supply means and said air exhaust means includes a fan and a filter respectively conveying and filtering said air which is supplied and exhausted.

4. The method according to claim 2, wherein said air discharge means is arranged for discharging air for cooling a control unit disposed below said wire bonder mechanism, together with said supplied clean air.

5. A manufacturing method for semiconductor integrated devices comprising:
molding a semiconductor integrated device chip in resin between upper and lower molding blocks located within a housing of a molding machine while producing a clean gas flow which flows through a space between upper and lower blocks of the molding machine, when the blocks are opened, to prevent adhesion of dust to surfaces of the chip by supplying clean gas from a clean gas supply means to one side of the area between said upper and lower cavity blocks under a position pressure in a direction toward a first side of said chip and drawing said gas through exhaust duct means of gas exhaust means in a location facing said clean gas supply means on a side of said chip opposite to said first side.

6. A manufacturing method for semiconductor integrated devices comprising:
connecting bonding wires between electrode pads disposed on a semiconductor integrated device chip and outer electrodes while producing a clean gas down-flow to prevent adhesion of dust to surfaces of the chip or outer electrodes, said clean gas flow being produced by supplying clean gas from a clean gas supply means disposed above said chip under a positive pressure in a direction toward a first side of said chip, and forcibly exhausting said gas through gas exhaust means disposed below said chip in a location facing said clean gas supply means on a side of said chip opposite to said first side to thereby produce a downward flow of clean gas toward the chip.

* * * * *